(12) United States Patent
Taira

(10) Patent No.: US 10,014,426 B2
(45) Date of Patent: Jul. 3, 2018

(54) SOLAR CELL AND SOLAR CELL MODULE

(71) Applicant: Panasonic Intellectual Property Management Co., Ltd., Osaka (JP)

(72) Inventor: Shigeharu Taira, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/218,054

(22) Filed: Jul. 24, 2016

(65) Prior Publication Data

US 2016/0336472 A1 Nov. 17, 2016

Related U.S. Application Data

(63) Continuation of application No. 13/927,409, filed on Jun. 26, 2013, now Pat. No. 9,425,340, which is a
(Continued)

(30) Foreign Application Priority Data

Dec. 29, 2010 (JP) .................................. 2010-294493

(51) Int. Cl.
*H01L 31/056* (2014.01)
*H01L 31/052* (2014.01)
(Continued)

(52) U.S. Cl.
CPC .. *H01L 31/0508* (2013.01); *H01L 31/022425* (2013.01); *H01L 31/022475* (2013.01);
(Continued)

(58) Field of Classification Search
CPC ........................... H01L 31/0508; H01L 31/056
See application file for complete search history.

(56) References Cited

U.S. PATENT DOCUMENTS 6,091,019 A 7/2000 Sakata et al.
6,388,301 B1 * 5/2002 Tawada ............... H01L 31/0236
257/436
(Continued)

FOREIGN PATENT DOCUMENTS

EP 1883117 A2 1/2008
EP 2418689 A2 2/2012
(Continued)

OTHER PUBLICATIONS

The Extended European Search Report dated Nov. 27, 2017 for a counterpart European application No. 11854039.2.

*Primary Examiner* — Tae-Sik Kang
(74) *Attorney, Agent, or Firm* — METROLEXIS LAW GROUP, PLLC

(57) ABSTRACT

To provide a solar cell having improved photoelectric conversion efficiency and a solar cell module. A solar cell (10) is provided with a photoelectric conversion portion (20), a light receiving surface electrode (21*a*) and a back surface electrode (21*b*). The light receiving surface electrode (21*a*) is arranged on the light receiving surface (20*a*) of the photoelectric conversion portion (20). The back surface electrode (21*b*) is arranged on the back surface (20*b*) of the photoelectric conversion portion (20). The back surface electrode (21*b*) includes metal film (21*b*1) and an electrical connection electrode (21*b*2). The metal film (21*b*1) at least partially covers the back surface (20*b*). The electrical connection electrode (21*b*2) is arranged on the metal film (21*b*1).

5 Claims, 10 Drawing Sheets

Related U.S. Application Data continuation of application No. PCT/JP2011/079461, filed on Dec. 20, 2011.

(51) Int. Cl.
*H01L 31/05* (2014.01)
*H01L 31/0224* (2006.01)

(52) U.S. Cl.
CPC .... *H01L 31/022483* (2013.01); *H01L 31/052* (2013.01); *H01L 31/0504* (2013.01); *H01L 31/056* (2014.12); *Y02E 10/52* (2013.01)

(56) References Cited

U.S. PATENT DOCUMENTS

| | | |
|---|---|---|
| 2008/0023069 A1 | 1/2008 | Terada et al. |
| 2010/0037941 A1 | 2/2010 | William et al. |
| 2011/0011440 A1 | 1/2011 | Hioki et al. |
| 2011/0048492 A1* | 3/2011 | Nishiwaki ........... H01L 31/0504 136/244 |
| 2011/0126893 A1* | 6/2011 | Myong ............... H01L 31/0745 136/255 |
| 2011/0186117 A1* | 8/2011 | Kumar .............. H01L 31/02168 136/256 |
| 2012/0031457 A1* | 2/2012 | Taira ................... H01L 31/0508 136/244 |
| 2012/0037200 A1 | 2/2012 | Hong et al. |
| 2016/0005904 A1 | 1/2016 | Hong et al. |

FOREIGN PATENT DOCUMENTS

| | | | |
|---|---|---|---|
| EP | 2461367 A2 * | 6/2012 | ..... H01L 31/022433 |
| JP | 2003-303980 A | 10/2003 | |
| JP | 2007-214455 A | 8/2007 | |
| JP | 2008-135565 A | 6/2008 | |
| JP | 2010-004083 A | 1/2010 | |
| JP | WO 2010095583 A1 * | 8/2010 | ......... H01L 31/0508 |
| JP | 2010-192858 A | 9/2010 | |
| JP | WO 2011013814 A2 * | 2/2011 | ..... H01L 31/022433 |
| WO | 2009-122977 A1 | 10/2009 | |
| WO | 2010-095583 A1 | 8/2010 | |

\* cited by examiner

SOLAR CELL AND SOLAR CELL MODULE

CROSS-REFERENCE TO RELATED APPLICATIONS

This application is a continuation of U.S. patent application Ser. No. 13/927,409, filed on Jun. 26, 2013, which is a continuation of International Application No. PCT/JP2011/079461, filed on Dec. 20, 2011, entitled "SOLAR CELL AND SOLAR CELL MODULE", which claims priority based on Article 8 of Patent Cooperation Treaty from prior Japanese Patent Application No. 2010-294493, filed on Dec. 29, 2010, the entire contents of all of which are incorporated herein by reference.

FIELD OF THE INVENTION

The present invention relates to a solar cell and a solar cell module.

BACKGROUND

In recent years, solar cells have garnered a great deal of attention as an energy source having a low environmental impact. In the example described in Patent Document 1 below, the solar battery cell has a photoelectric conversion portion, a light receiving surface electrode arranged on the light-receiving surface of the photoelectric conversion portion, and a back surface electrode arranged on the back surface. In the solar cell described in Patent Document 1, both the light receiving surface electrode and the back surface electrode are provided with a plurality of finger electrode portions, and a busbar portion electrically connected to the plurality of finger electrode portions.

PRIOR ART DOCUMENTS

Patent Documents

Patent Document 1: Laid-Open Patent Publication No. 2009-290234

SUMMARY

Problem Solved by the Invention

There is growing demand for greater photoelectric conversion efficiency in solar cells.

In light of this situation, the purpose of the present invention is to provide a solar cell and solar cell module with improved photoelectric conversion efficiency.

Means of Solving the Problem

The solar cell in one aspect of the present invention is provided with a photoelectric conversion portion, a light receiving surface electrode, and a back surface electrode. The light receiving surface electrode is arranged on the light receiving surface of the photoelectric conversion portion. The back surface electrode is arranged on the back surface of the photoelectric conversion portion. The back surface electrode includes metal film and an electrical connection electrode. The metal film at least partially covers the back surface. The electrical connection electrode is arranged on the metal film.

The solar cell module in another aspect of the present invention is provided with a plurality of solar cells and wiring material electrically connecting the plurality of solar cells. Each of the solar cells is provided with a photoelectric conversion portion, a light receiving surface electrode, and a back surface electrode. The light receiving surface electrode is arranged on the light receiving surface of the photoelectric conversion portion. The back surface electrode is arranged on the back surface of the photoelectric conversion portion. The back surface electrode includes metal film and an electrical connection electrode. The metal film at least partially covers the back surface. The electrical connection electrode is arranged on the metal film.

Effect of the Invention

The present invention is able to provide a solar cell and solar cell module with improved photoelectric conversion efficiency.

DETAILED DESCRIPTION

Figure 1:
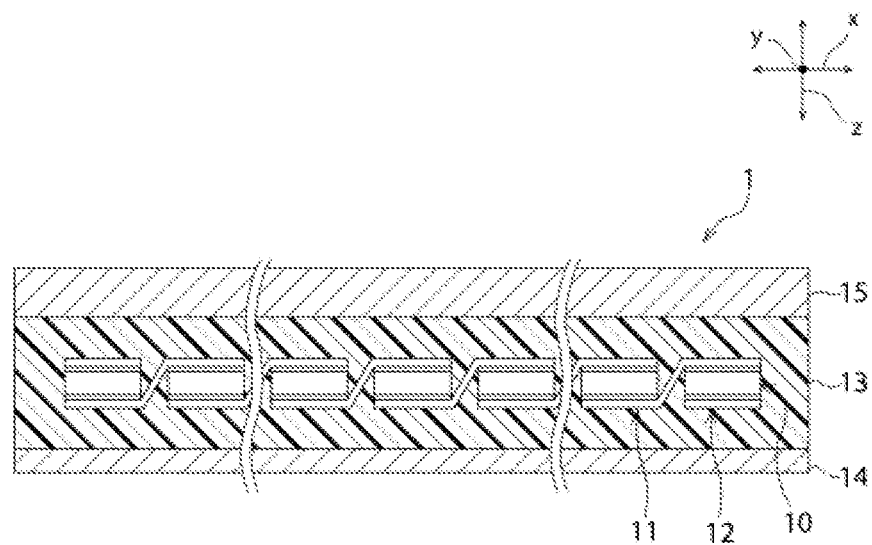
FIG. 1 is a schematic cross-sectional view of the solar cell module in a first embodiment.

The following is an explanation of preferred embodiments of the present invention. The following embodiments are merely illustrative. The present invention is not limited to these embodiments.

Further, in each of the drawings referenced in the embodiments, members having substantially the same function are denoted by the same symbols. The drawings referenced in the embodiments are also depicted schematically. The dimensional ratios of the objects depicted in the drawings may differ from those of the actual objects. The dimensional ratios of objects may also vary between drawings. The specific dimensional ratios of the objects should be determined with reference to the following explanation.

1st Embodiment (Schematic Configuration of the Solar Cell Module 1)

As shown in FIG. 1, the solar cell module 1 is provided with a plurality of solar cells 10 arranged in the x direction. The plurality of solar cells 10 are connected electrically by wiring material 11. More specifically, solar cells 10 adjacent to each other in the x direction are connected to each other electrically by wiring material 11 to electrically connect the plurality of solar cells 10 in series or in parallel.

A first protective member 14 is arranged on the rear surface side of the solar cells 10. A second protective member 15 is arranged on the light receiving surface side of the solar cells 10. A sealing material 13 is provided between the solar cells 10 and the first protective member 14 and between the solar cells 10 and the second protective member 15. The solar cells 10 are sealed by the sealing material 13.

There are no particular restrictions on the sealing material 13 or the material used in the first and second protective members 14, 15. The sealing material 13 can be formed using a resin with transparent properties, such as an ethylene-vinyl acetate (EVA) copolymer or polyvinyl butyral (PVB).

The first and second protective members 14, 15 can be made of glass or resin. The first protective member 14 arranged on the back surface of the solar cell 10 may be made of a metal foil such as aluminum foil interposed between resin film. The second protective member 15 is arranged on the light receiving surface side of the solar cell 10, and is made of a material such as glass or a transparent resin.

If necessary, a frame made of a metal such as Al (not shown) can be attached to the peripheral surface of a laminate comprising a first protective member 14, sealing material 13, solar cells 10, sealing material 13 and a second protective member 15. Also, if necessary, wiring material and a terminal box may be provided on the surface of the first protective member 14 to extract the output of the solar cells 10.

(Structure of the Solar Cell 10)

Figure 2:
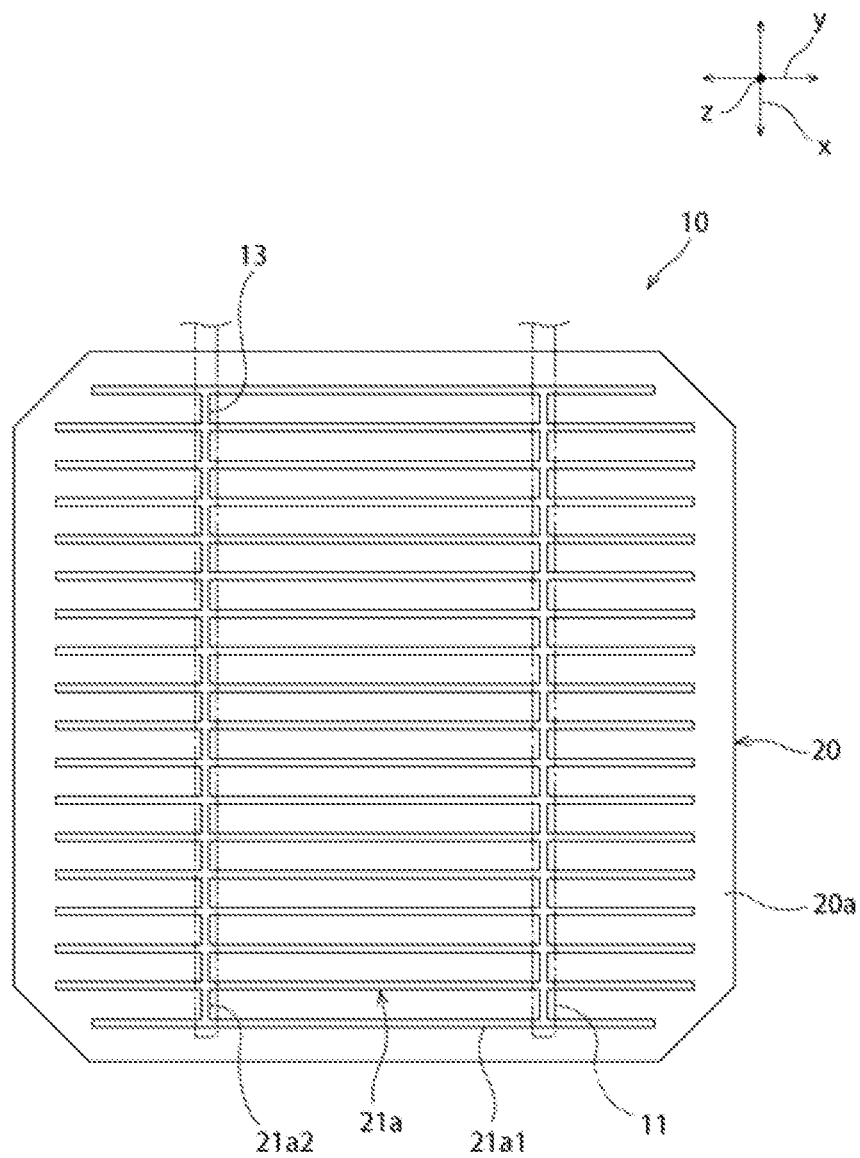
FIG. 2 is a schematic plan view of the light receiving surface of the solar cell in the first embodiment.
Figure 3:
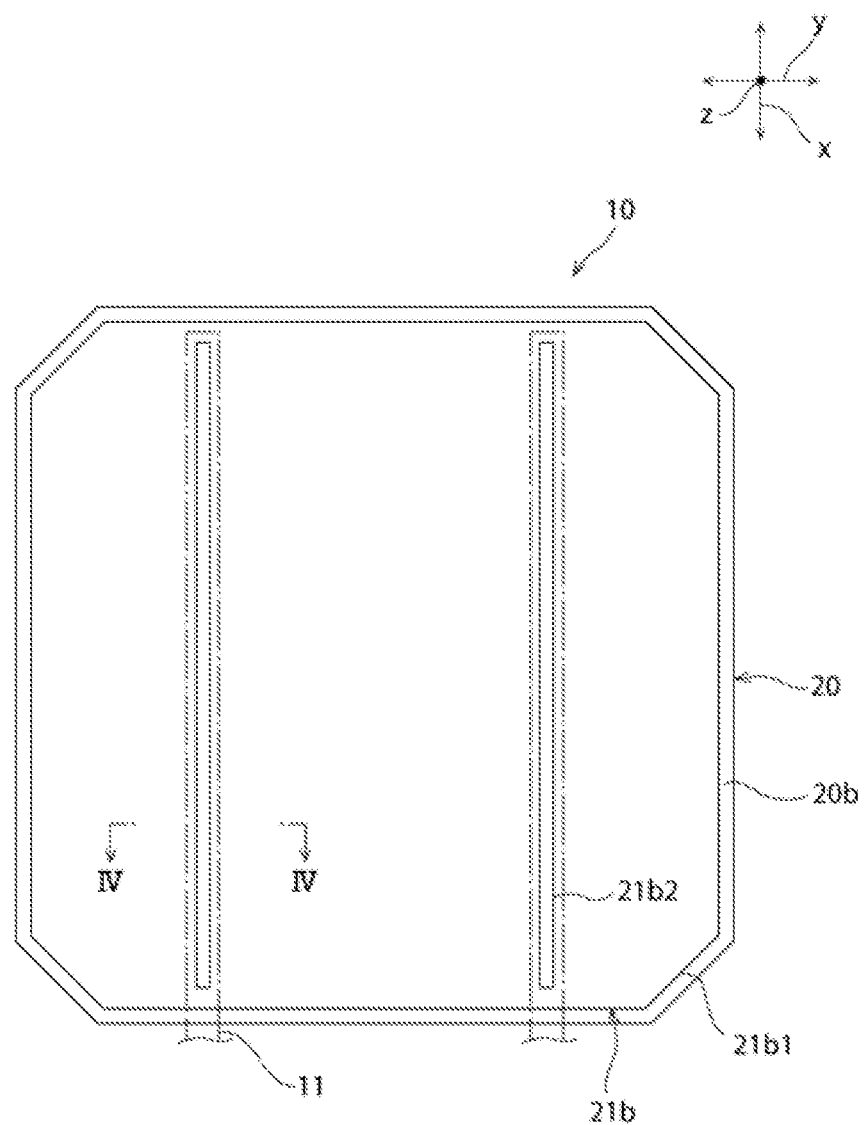
FIG. 3 is a schematic plan view of the back surface of the solar cell in the first embodiment.
Figure 4:
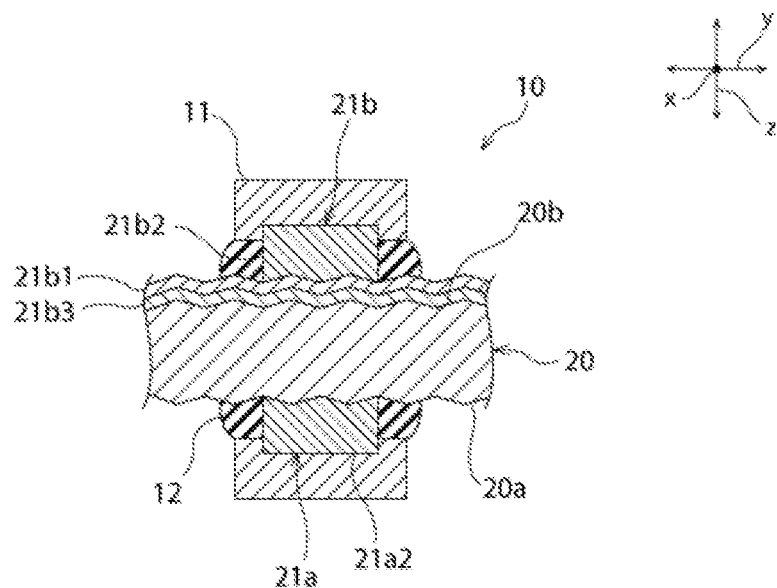
FIG. 4 is a schematic cross-sectional view from line IV-IV in FIG. 3.
Figure 5:
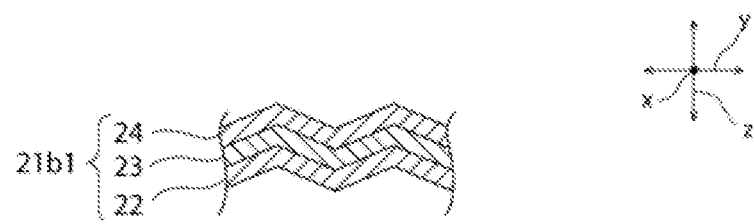
FIG. 5 is a schematic cross-sectional view in which a portion of the metal film has been enlarged.

As shown in FIG. 2 through FIG. 4, the solar cell 10 has a photoelectric conversion portion 20. The photoelectric conversion portion 20 generates carriers such as electrons and holes from received light. The photoelectric conversion portion 20 may have, for example, a crystalline semiconductor substrate of one conductive type, a first amorphous semiconductor layer of the other conductive type arranged on one of the main surfaces of the substrate, and a second amorphous semiconductor layer of the one conductive type on the other main surface of the substrate. Here, an i-type amorphous semiconductor layer of a thickness that does not substantially contribute to the generation of electricity may be provided between the crystalline semiconductor substrate and at least one of the first and second amorphous semiconductor layers. The photoelectric conversion portion 20 may also have a semiconductor substrate having an n-type dopant diffusion region and p-type dopant diffusion region exposed on the surface.

In the present embodiment, both the light-receiving surface 20*a* and the rear surface 20*b* of the photoelectric conversion portion 20 has a textured structure. Here, "textured structure" means an uneven structure formed to inhibit surface reflection and increase the amount of light absorbed by the photoelectric conversion portion. A specific example of a textured structure is a pyramidal uneven structure (pyramid or truncated pyramid) obtained by performing anisotropic etching on the surface of a single-crystal silicon substrate having a (100) plane.

A light receiving surface electrode 21*a* is arranged on the light-receiving surface 20*a* of the photoelectric conversion portion 20. The light receiving surface electrode 21*a* has a plurality of finger electrode portions 21*a*1 and a plurality of busbar portions 21*a*2. Each of the finger electrode portions 21*a*1 has a linear shape and extends in the y direction. The finger electrode portions 21*a*1 are arranged at a predetermined interval in the x direction. Each of the busbar portions 21*a*2 extends in the x direction. Each of the busbar portions 21*a*2 is connected electrically to the finger electrode portions 21*a*1.

There are no particular restrictions on the configuration of the light receiving surface electrode in the present invention. The light receiving surface electrode may consist, for example, only of a plurality of finger electrode portions. This is known as a busbarless electrode, which does not have any busbar portion. The light receiving surface electrode 21*a* may also have transparent conductive film provided so as to come into contact with the light-receiving surface 20*a* of the photoelectric conversion portion 20. The transparent conductive film can be made of a transparent conductive oxide such as indium tin oxide (ITO) or ZnO.

The light receiving surface electrode 21*a* primarily makes electrical contact with the wiring material 11 in the busbar portion 21*a*2. The busbar portion 21*a*2 and the wiring material 11 can be connected using solder or a resin adhesive.

The resin adhesive may have conductive properties and may have insulating properties. When a resin adhesive with insulating properties is used, the busbar portion 21*a*2 and the wiring material 11 have to be connected by establishing contact. More specifically, the busbar portion 21*a*2 may be embedded in the wiring material 11 to connect the light receiving surface electrode 21*a* and the wiring material 11 to each other electrically, or the wiring material may be embedded in the busbar portion to connect the light receiving surface electrode 21*a* and the wiring material 11 to each other electrically. The surface of the wiring material and/or busbar portion may also be formed unevenly, and the uneven surface crushed against the other member.

A resin adhesive with anisotropic conductive properties is preferably used as the resin adhesive with conductive properties.

The material in light receiving surface electrode 21*a* may be any conductive material. The light receiving surface electrode 21*a* may be made of a metal such as silver, copper, aluminum, titanium, nickel or chrome, or an alloy of one or more of these metals. The light receiving surface electrode 21*a* may also be made of a laminate having a plurality of conductive layers made, in turn of a metal or metal alloy.

There are no particular restrictions on the method used to form the light receiving surface electrode 21*a*. The light receiving surface electrode 21*a* may be formed, for example, using a conductive paste, such as Ag paste, or by using a sputtering method, vapor deposition method, screen printing method or plating method.

The back surface electrode 21*b* is arranged on the back surface 20*b* of the photoelectric conversion portion 20. The back surface electrode 21*b* includes metal film 21*b*1, an electrical connection electrode 21*b*2, and transparent conductive film 21*b*3.

In the present invention, "metal film" includes alloy film.

The metal film 21*b*1 at least partially covers the back surface 20*b*. More specifically, in the present embodiment, the metal film 21*b*1 covers the entire back surface 20*b* except for the edges.

The metal film 21*b*1 is thick enough to have an uneven shape that corresponds to the textured structure on the surface of the metal film 21*b*1 opposite that of the back surface 20*b*. More specifically, the thickness of the metal film 21*b*1 is preferably from 0.1 µm to 5 µm.

The material in the metal film 21*b*1 may be any highly reflective and highly conductive metal. The metal film 21*b*1 can be formed of a metal such as Ag, Al, Cu, Ni, Cr, Ti, Sn or Zn, or of a metal including one or more of these metals. The metal film 21b1 can also be a laminate made of more than one metal or metal alloy film.

More specifically, in the present embodiment, the metal film 21b1 is a laminate comprising a first Ag film 22 arranged on the back surface 20b, Al film 23 arranged on the first Ag film 22, and a second Ag film 24 arranged on the Al film 23. Because Al film is interposed in the middle of the laminate in the present embodiment, the costs associated with forming the metal film 21b1 can be reduced. Because Ag film is provided on both sides, the reflectivity of the metal film 21b1 is increased, and changes in the surface characteristics of the metal film 21b1 can be suppressed. Cu film may be interposed between the first Ag film 22 and the second Ag film 24 instead of Al film 23.

The thickness of the first Ag film 22 is preferably from 0.1 µm to 1 µm. The thickness of the Al film 23 is preferably from 0.1 µm to 1 µm. The thickness of the second Ag film 24 is preferably from 0.1 µm to 1 µm. However, the film in the present invention is not limited to these ranges.

There are no particular restrictions on the method used to form the metal film 21b1. The metal film 21b1 may be formed using a conductive paste such as Ag paste. The metal film 21b1 may also be formed using a sputtering method, vapor deposition method, screen printing method, inkjet method or plating method.

Transparent conductive film 21b3 is arranged between the metal film 21b1 and the back surface 20b. This conductive transparent film 21b3 is used to bond the metal film 21b1 more securely to the back surface 20b. The transparent conductive film 21b3 can be formed using a transparent conductive oxide such as indium tin oxide (ITO) or zinc oxide. The thickness of the transparent conductive film 21b3 is preferably from 0.5 µm to 3 µm.

An electrical connection electrode 21b2 is arranged on the metal film 21b1. The back surface electrode 21b is connected electrically to the wiring material 11 primarily in the electrical connection electrode 21b2. The electrical connection electrode 21b2 and the wiring material 11 can be connected using solder or a resin adhesive.

When the back surface electrode 21b and wiring material 11 are connected electrically using a conductive and insulating resin adhesive, the electrical connection electrode 21b2 should be embedded in the wiring material 11. The wiring material may also be embedded in the electrical connection electrode. The surface of the wiring material and/or electrical connection electrode may also be formed unevenly, and the uneven surface crushed against the other member. Because this increases the contact area between the electrical connection electrode 21b2 and the wiring material 11, resistance loss can be reduced.

A resin layer is preferably provided on at least the interface between the electrical connection electrode 21b2 and the metal film 21b1 or on the peripheral portion of the electrical connection electrode 21b2. This resin layer protects the interface between the electrical connection electrode 21b2 and the transparent conductive film 21b3. As a result, reliability can be improved.

There are no particular restrictions on the materials constituting the resin layer, but it preferably includes a resin containing conductive paste when the electrical connection electrode 21b2 and the metal film 21b1 are formed using a resin-based conductive paste. This protects the interface between the electrical connection electrode 21b2 and the metal film 21b1 from external shocks, and improves reliability. There are no particular restrictions on the shape of the electrical connection electrode 21b2. In the present invention, the electrical connection electrode 21b2 is linear and extends in the x direction. The electrical connection electrode 21b2 extends from one end of the back surface 20b to the other in the x direction. There are no particular restrictions on the width of the electrical connection electrode 21b2. It is preferably from 0.05 µm to 2 mm, and more preferably from 0.05 µm to 1 mm.

In the present embodiment, there are two electrical connection electrodes 21b2 arranged in the y direction. However, the present invention is not limited to this configuration. There may be a single electrical connection electrode 21b2, or three or more electrodes provided in the y direction.

The electrical connection electrode 21b2 is preferably thicker than the metal film 21b1. More specifically, the thickness of the electrical connection electrode 21b2 is preferably from 5 µm to 20 µm.

The material in the electrical connection electrode 21b2 may be any conductive material. For example, the electrical connection electrode 21b2 may be made of a metal such as Cu, Ag or Sn, or an alloy containing at least one of these metals. The electrical connection electrode 21b2 may also be a laminate including a plurality of metal or metal alloy films.

There are no particular restrictions on the method used to form the electrical connection electrode 21b2. The electrical connection electrode 21b2 may be formed, for example, using a conductive paste, such as Ag paste. The electrical connection electrode 21b2 may also be formed by using a sputtering method, vapor deposition method, screen printing method, dispensing method, offset printing method or inkjet method.

As explained above, metal film 21b1 is provided in the present embodiment. The metal film 21b1 at least partially covers the back surface 20b. The metal film 21b1 is used to reflect light passing through the photoelectric conversion portion 20 towards the light-receiving surface 20a. In this way, the light can be more effectively utilized.

Also, the metal film 21b1 is thick enough to have an uneven shape corresponding to the textured structure on the surface of the metal film 21b1 opposite that of the back surface 20b. This can extend the length of the optical path of the light reflected by the metal film 21b1 in the photoelectric conversion portion 20. As a result, photoelectric conversion efficiency can be improved even further. Also, stress caused by the difference in thermal expansion coefficients between the metal film and the photoelectric conversion portion 20 can be reduced. This allows the thickness of the semiconductor substrate used in the photoelectric conversion portion 20 to be reduced to less than 180 µm.

The thickness of the transparent conductive film 21b3 is preferably from 50 nm to 200 nm. This can increase reflectivity on the back surface.

The thickness of the metal film 21b1 is preferably 0.1 µm or less from the perspective of improving photoelectric conversion efficiency even further. The thickness of the metal film 21b1 is preferably 5 µm or less from the perspective of improving reliability even further.

The electrical connection electrode 21b2 is preferably thicker than the metal film 21b1 from the perspective of making the connection between the electrical connection electrode 21b2 and wiring material 11 more reliable. More specifically, the thickness of the electrical connection electrode 21b2 is preferably 5 µm or greater. However, when the electrical connection electrode 21b2 is too thick, stress causes the electrical connection electrode 21b2 to peel off the metal film. Therefore, the thickness of the electrical connection electrode 21b2 is preferably 20 µm or less.

In the present embodiment, the electrical connection electrode 21b2 extends from one end of the back surface 20b to the other in the x direction. This can reduce the stress per unit area even when stress increases between the wiring material 11 and the electrical connection electrode 21b2 due to a temperature change or some other factor. As a result, peeling of the wiring material 11 can be more effectively suppressed.

In the present embodiment, the back surface 20b has a textured structure. As a result, light is scattered on the back surface 20b, sealing off the photoelectric conversion portion 20 from the light. This can further improve photoelectric conversion efficiency.

Also, the metal film 21b1 is thick enough to have an uneven shape corresponding to the textured structure on the surface of the metal film 21b1 opposite that of the back surface 20b. This increases the bonding strength between the metal film 21b1 and the electrical connection electrode 21b2.

Further, by providing a resin layer between the metal film 21b1 and the electrical connection electrode 21b2 and on the periphery of the electrical connection electrode 21b2, the interface between the metal film 21b1 and the electrical connection electrode 21b2 can be protected from external shocks, and overall reliability can be improved.

The following is an explanation of other preferred embodiments of the present invention. In the following explanation, members having substantially the same function as those in the first embodiment are denoted by the same symbols, and further explanation of these members has been omitted.

In the first embodiment, the electrical connection electrode 21b2 was a linear electrode. However, the shape of the electrical connection electrode in the present invention is not limited to the shape in this embodiment.

Figure 6:
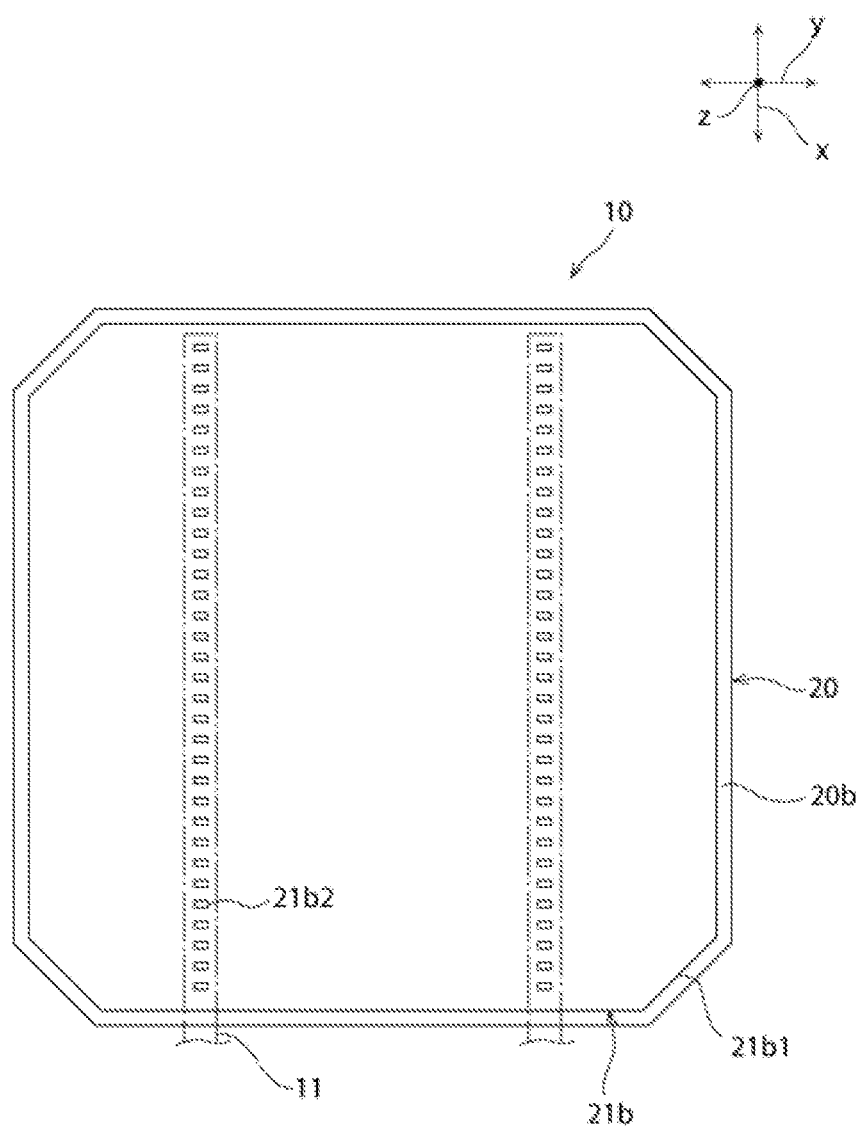
FIG. 6 is a schematic plan view of the back surface of the solar cell in a second embodiment.
Figure 7:
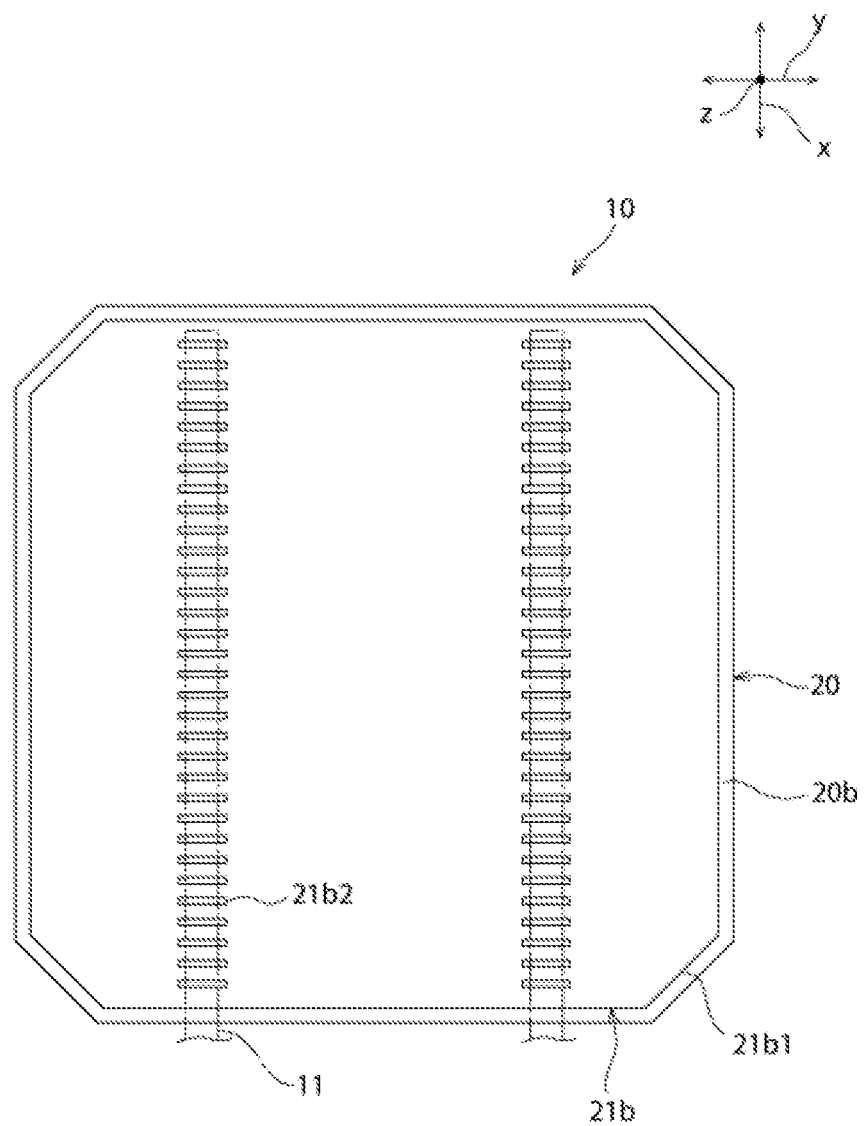
FIG. 7 is a schematic plan view of the back surface of the solar cell in a third embodiment.

For example, as shown in FIG. 6 and FIG. 7, the electrical connection electrode 21b2 may be a plurality of linear electrodes arranged in the x direction and each extending in the y direction. Here, the linear electrodes may all be positioned underneath the wiring material 11, as shown in FIG. 6, or may have ends positioned to the outside of the wiring material 11, as shown in FIG. 7.

Figure 8:
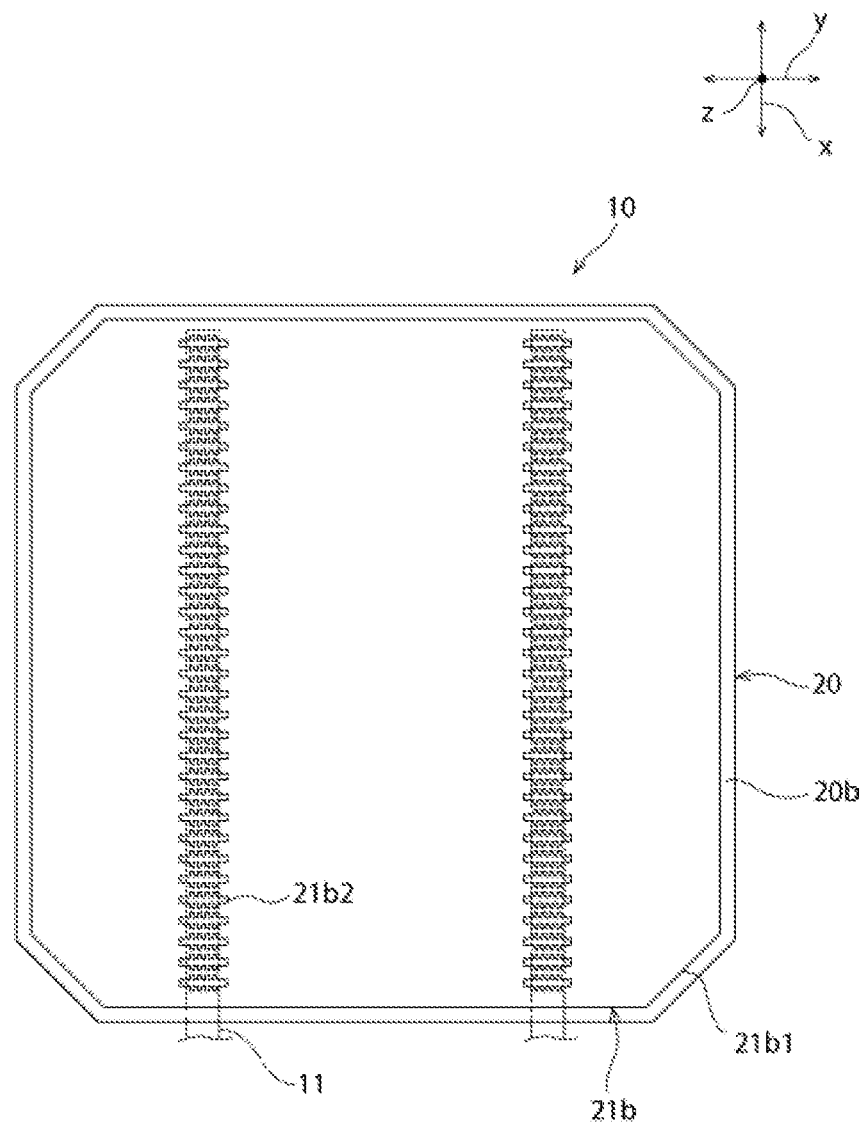
FIG. 8 is a schematic plan view of the back surface of the solar cell in a fourth embodiment.

As shown in FIG. 8, the electrical connection electrode 21b2 may be a plurality of electrodes each including first linear electrode portions arranged in the x direction and extending in the y direction, and second linear electrode portions intersecting the first linear electrode portions and extending in the x direction.

Figure 9:
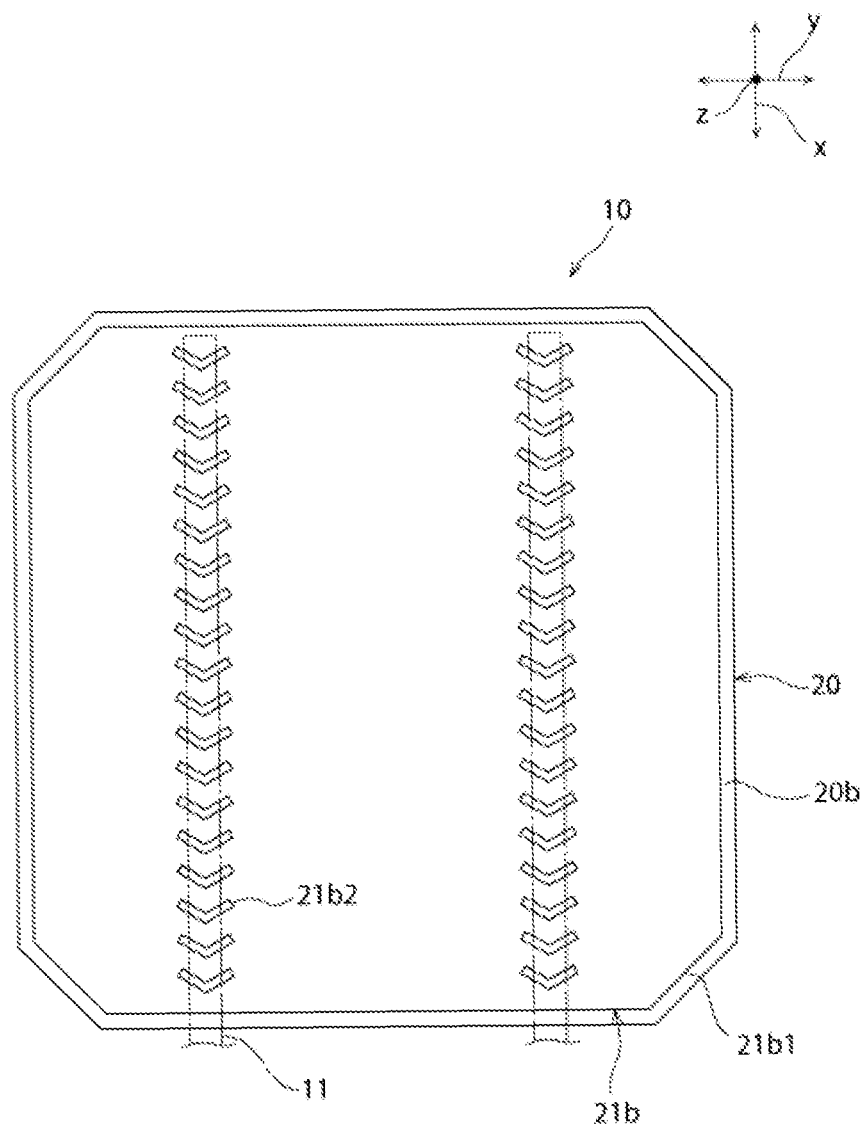
FIG. 9 is a schematic plan view of the back surface of the solar cell in a fifth embodiment.

As shown in FIG. 9, the electrical connection electrode 21b2 may be a plurality of V-shaped electrodes arranged in the x direction.

Figure 10:
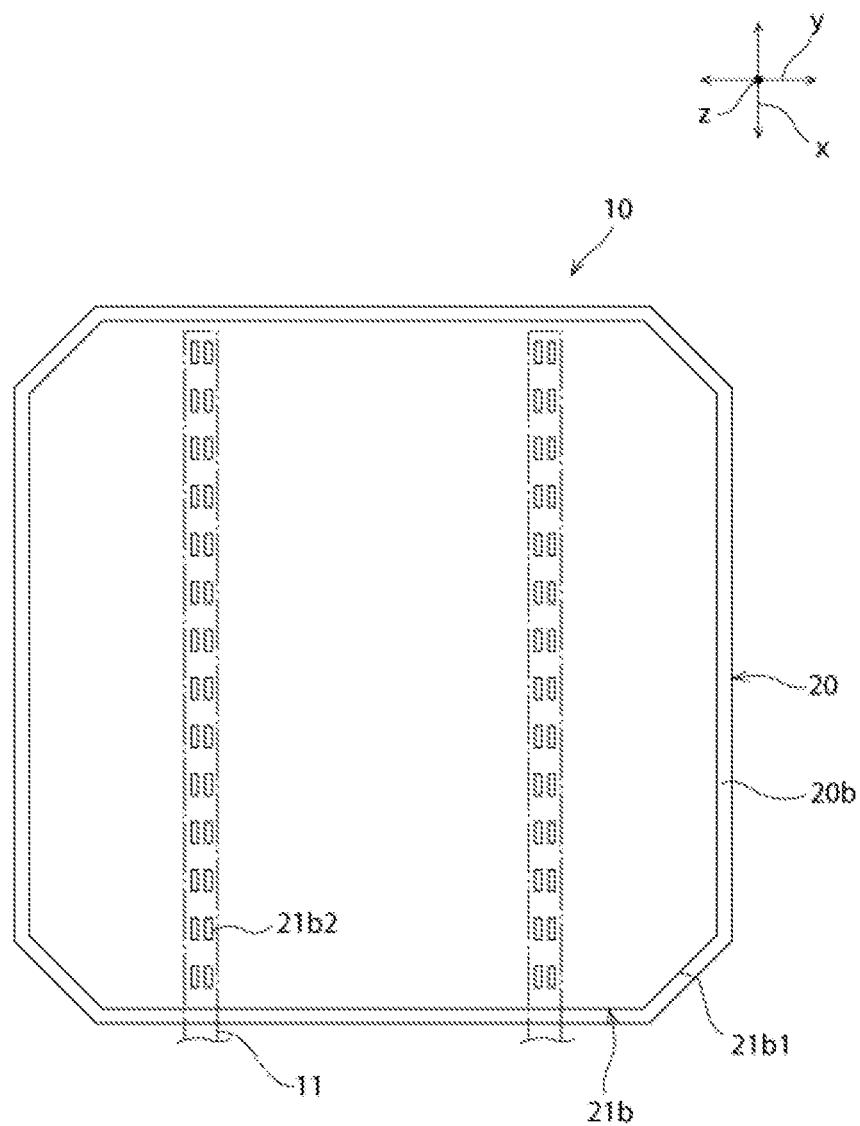
FIG. 10 is a schematic plan view of the back surface of the solar cell in a sixth embodiment.

As shown in FIG. 10, the electrical connection electrode 21b2 may be a plurality of linear electrodes arranged in the form of a matrix.

Figure 11:
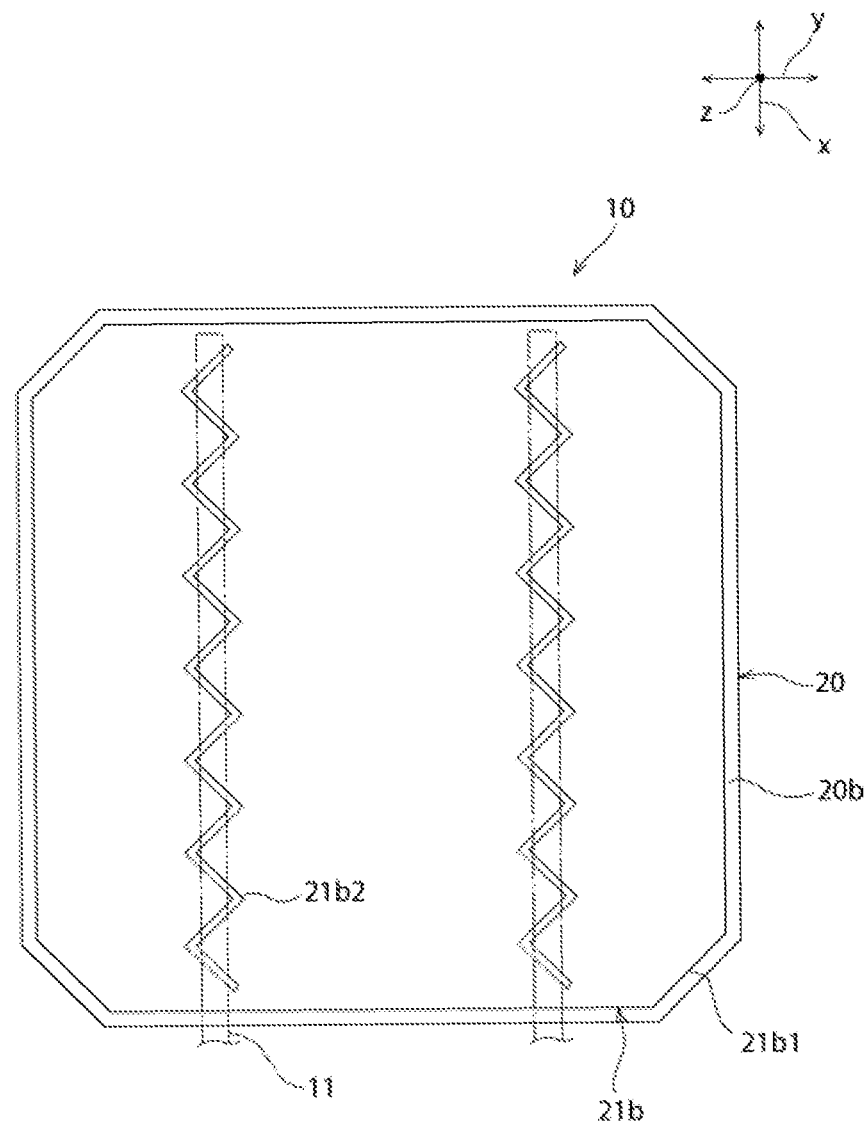
FIG. 11 is a schematic plan view of the back surface of the solar cell in a seventh embodiment.

As shown in FIG. 11, the electrical connection electrode 21b2 may be a zigzag-shaped electrode.

KEY TO THE DRAWINGS

1: solar cell module
10: solar cell
11: wiring material
13: sealing material
14: 1st protective member
15: 2nd protective member
20: photoelectric conversion portion
20a: light receiving surface
20b: back surface
21a: light receiving surface electrode
21a1: finger electrode portion
21a2: busbar portion
21b: back surface electrode
21b1: metal film
21b2: electrical connection electrode
21b3: transparent conductive film
22: 1st Ag film
23: Al film
24: 2nd Ag film

What is claimed is:

1. A solar cell module comprising:
a plurality of solar cells; and
wiring materials electrically connecting the plurality of solar cells, the wiring materials being arranged side by side in a first direction comprising a width direction of each of the wiring materials, each of the wiring materials extending in a second direction comprising a longitudinal direction thereof, the second direction orthogonal to the first direction, wherein
each solar cell comprises:
a photoelectric conversion portion having a crystalline semiconductor substrate, a light receiving surface and a textured back surface of the photoelectric conversion portion,
a light receiving surface electrode arranged on the light receiving surface of the photoelectric conversion portion, and
a back surface electrode arranged on the textured back surface of the photoelectric conversion portion, the back surface electrode including a textured, multi-layered metal film covering an entirety of the back surface except for a periphery area on the back surface, a transparent conductive film between the metal film and the back surface, and electrical connection electrodes intermittently provided on the metal film along the longitudinal direction of each of the wiring materials in the first direction, wherein the wiring materials are attached to the electrical connection electrodes via adhesive and electrically connected to the electrical connection electrodes, respectively, such that widthwise ends of each of the electrical connection electrodes in the second direction are provided outside of widthwise ends of a corresponding one of the wiring materials in the second direction in a view along a normal direction orthogonal to the back surface
an end of one of the wiring materials in the longitudinal direction is in an area of the metal film in one of the plurality of solar cells and another end of the one of the wiring materials in the longitudinal direction is outside of the area of the metal film in the one of the plurality of solar cells.

2. The solar cell module according to claim 1, wherein the electrical connection electrodes comprise:
first linear electrode portions arranged extending in the width direction; and
second linear electrode portions extending in the longitudinal direction.

3. The solar cell module according to claim 1, wherein the electrical connection electrodes comprise a plurality of V-shaped electrodes.

4. The solar cell module according to claim 1, wherein the electrical connection electrodes comprise a plurality of electrodes arranged in a form of a matrix.

5. A solar cell module comprising:
solar cells; and
wiring materials electrically connecting the solar cells, the wiring materials being arranged side by side in a first direction comprising a width direction of each of the wiring materials, each of the wiring materials extending in a second direction comprising a longitudinal direction thereof, the second direction orthogonal to the first direction, wherein
each solar cell comprises:
   a photoelectric conversion portion having a crystalline semiconductor substrate, and a light receiving surface and a textured back surface of the photoelectric conversion portion,
   a light receiving surface electrode arranged on the light receiving surface of the photoelectric conversion portion, and
   a back surface electrode arranged on the textured back surface of the photoelectric conversion portion, the back surface electrode including a textured, multi-layered metal film covering an entirety of the back surface except for an edge section of the back surface, a transparent conductive film between the metal film and the back surface, and electrical connection electrodes intermittently provided on the metal film along the longitudinal direction of each of the wiring materials in the first direction, wherein the wiring materials are attached to the electrical connection electrodes via adhesive and electrically connected to the electrical connection electrodes, respectively, such that widthwise ends of each of the electrical connection electrodes in the second direction are provided outside of widthwise ends of a corresponding one of the wiring materials in the second direction in a view along a normal direction orthogonal to the back surface.

* * * * *